(12) United States Patent
Tedrow et al.

(10) Patent No.: US 8,176,232 B2
(45) Date of Patent: May 8, 2012

(54) DEDICATED INTERFACE TO FACTORY PROGRAM PHASE-CHANGE MEMORIES

(75) Inventors: Kerry Dean Tedrow, Folsom, CA (US); Nicholas Hendrickson, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 400 days.

(21) Appl. No.: 12/464,036

(22) Filed: May 11, 2009

(65) Prior Publication Data

US 2010/0287435 A1  Nov. 11, 2010

(51) Int. Cl.
*G06F 12/00* (2006.01)

(52) U.S. Cl. ......... 711/103; 711/101; 711/102; 711/105

(58) Field of Classification Search .......... 711/101–103, 711/115, 4–5; 710/1–5, 36, 22; 714/748, 714/807
See application file for complete search history.

(56) References Cited

U.S. PATENT DOCUMENTS

| 7,761,674 B2 * | 7/2010 | Durham et al. | 711/163 |
| 7,966,429 B2 * | 6/2011 | Chow et al. | 710/22 |
| 7,979,625 B2 * | 7/2011 | Le et al. | 711/103 |

* cited by examiner

*Primary Examiner* — David Lam
(74) *Attorney, Agent, or Firm* — Schwegman, Lundberg & Woessner, P.A.

(57) ABSTRACT

A nonvolatile memory device has a dedicated serial programming port to provide a data path to memory storage. A dedicated power pin supplies power for the programming port to receive data and provide storage in the nonvolatile memory while a power pin for normal device operation is not powered.

20 Claims, 1 Drawing Sheet

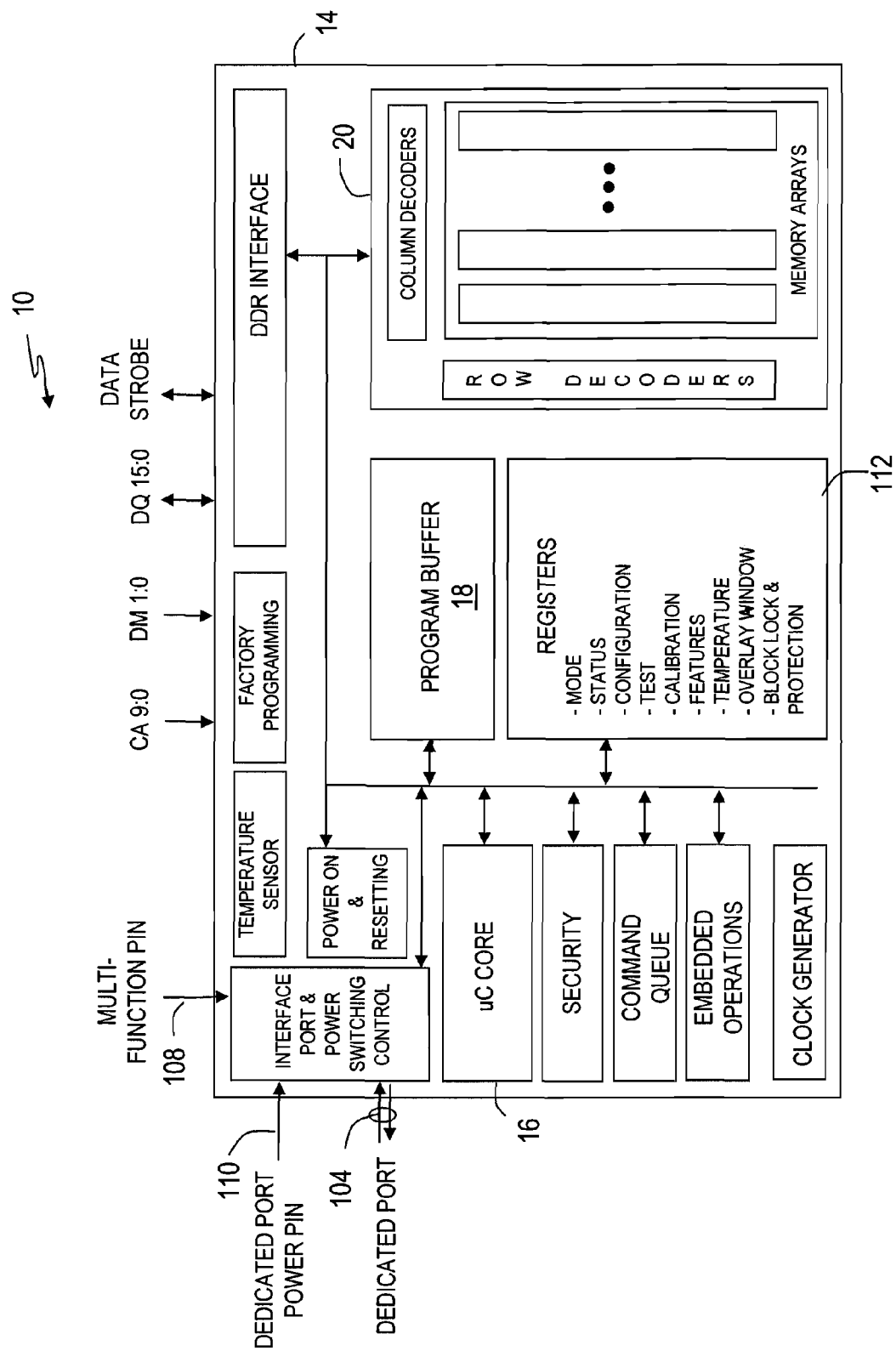

DEDICATED INTERFACE TO FACTORY PROGRAM PHASE-CHANGE MEMORIES

BACKGROUND OF THE INVENTION

The Phase-Change Memory (PCM) technology is a promising alternative to the current nonvolatile memory mainstream constituted by the Flash technology. Today, when manufacturing an electronic system using Flash technology the memory device is typically programmed prior to soldering it to the PC board in the assembly factory. However, PCM technology may lose data when subjected to the high temperature of soldering, and therefore, a cost-effective means for programming after soldering is needed to ensure data retention of PCM devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

The sole drawing is an embodiment of a device that illustrates a special pin to input in-factory data to a PCM device in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

FIG. 1 illustrates a schematic representation 10 of a nonvolatile memory device 14 having a direct access serial programming port on a nonvolatile memory device 14 that provides a programming path for in-factory programming following the high temperature exposure of soldering. The nonvolatile memory device 14 may include multiple banks of a Phase-Change Memory (PCM) 20 to provide flexibility for splitting the code and data spaces within the memory arrays. The PCM arrays may also be referred to as Phase-Change Random Access Memory (PRAM or PCRAM), Ovonic Unified Memory (OUM) or Chalcogenide Random Access Memory (C-RAM). The arrays of PCM cells include alloys of elements of group VI of the periodic table, elements such as Te or Se that are referred to as chalcogenides or chalcogenic materials.

When the memory arrays use chalcogenides advantageously in phase change memory cells to provide data retention, the data remains stable even after the power is removed from the nonvolatile memory. Taking the phase change material as $Ge_2Sb_2Te_5$ for example, two phases or more are exhibited having distinct electrical characteristics useful for memory storage. It should be noted that the chalcogenic material may be electrically switched between different states intermediate between the amorphous and the crystalline states, thereby giving rise to a multilevel storing capability.

The chalcogenide chemistry uses the application of heat to melt the material for the two energy states for any particular bit. However, the high energy bands of the phase change material may bring about instability in the retention of data when the memory device is subjected to external heat. For example, the high resistance amorphous state has sufficient activation energy as to be susceptible to relaxation into the crystalline state with the application of external heat, resulting in a loss of data.

With current-day Flash memories it is possible to program data after soldering to resolve data loss issues, but this is not typically done because existing flash memory interfaces are not well suited for this purpose. For example, existing flash memories have only one interface which is connected to the system processor. The processor may be disabled to allow the interface signals to be driven by external programming equipment, or the processor may be used to deliver data through this interface to program the memory.

When the processor delivers data to the memory, an external source uses a data path to transfer data to the processor. However, this data-path is problematic when PCM is used as the Flash memory because the processor's boot code is not available to initialize an external interface. Typically, this boot code is stored in the memory slot that would now be occupied by the PCM device. Therefore, a small flash memory device is supplied to store boot code, thus adding cost to the system.

The processor's external interface is likely a low speed interface that causes a programming time problems in the factory. One work around involves utilizing multiple programming stations to program multiple boards in parallel, but this adds cost because each board design requires a custom solution appropriate to the particular processor and memory interface used. In accordance with the present invention the memory device provides a second interface which is not connected to the processor, but instead is dedicated and optimized for factory programming.

FIG. 1 illustrates a direct access serial programming port 104 that allows a host device such as, for example, a factory programmer, to directly connect to memory device 14 without affecting the system to which the memory device is attached. The connection between the host and memory device 14 may be made with a cable suitable for serial communication. The serial port 104 on memory device 14 communicates via the cable with the host. Attributes of this serial link may specify, for example, the number of wires, the signaling method (differential or single-ended), the coding type (example, Manchester, NRZI), bus termination type, a data packet size, the hand-shaking protocol, error-correction method, cable type (example, twisted-pair, ribbon), cable length, etc. Although particular sets of attribute implementations have been defined to be industry-standard such as USB, Ethernet, IEEE 1394 (Firewire), or JTAG, the serial link used in this invention may or may not be one of these industry-standard types. Various embodiments using features of this invention may also use a non-standard set of implementations.

Memory device 14 provides multiple operating modes for transferring data over the serial link and selects the optimum speed for receiving programming data. From the factory standpoint, this multiple speed approach allows a factory to support many memory types with a single host and cable design, and thereby reduce factory equipment costs. The serial link may be designed to operate with multiple operating modes in support of different memory types. For example, the speed of the serial link may be determined by the logic transistors embedded within the memory device. The speed of the logic transistors for the different memory devices may vary and with the serial link supporting multiple operating speeds an optimum programming speed may be selected that is appropriate for the particular memory device.

The uC core 16 may be used to issue a device query command to identify the memory type being programmed and enable selection of the operating mode appropriate for each memory device type. The uC core 16 may also execute a data-throttling protocol when the link is capable of providing data faster than memory device 14 can process it. This allows memory device 14 to control the data rate by indicating when it is ready to receive new data.

To achieve a fast overall programming rate, a data pipelining scheme may be used that allows the serial link to transfer data to the memory device while the memory device is in the process of programming previously transferred data. In one embodiment of data pipelining, the memory device may be equipped with two data buffers, both of which can be accessed by the serial link and the memory device. The pipeline operation begins by having the serial link transfer data to the first buffer, and when the first buffer is fully loaded, then the serial link begins to transfer data to the second buffer concurrent with the memory device programming from the first buffer. When the second buffer data transfer and first buffer programming are both completed, the serial link then begins transferring data to the first buffer while the memory device programs from the second buffer. This alternating buffer cycle is repeated until the programming operation is completed.

It can be seen that when the memory device programming rate is equal to the serial link transfer rate that pipelining provides nearly a twofold increase in overall programming rate compared to a single buffer implementation where the data transfer and programming operations are done sequentially. The data pipelining scheme can be further improved by providing a pinging protocol to indicate when to switch buffers. Pinging is an operation where the serial link asks the memory device if the next buffer is available to receive new data. In one embodiment the serial link transfers a ping command to the memory device after the link has completed loading a buffer. The memory device replies with one of two responses; ready or busy. If the memory device has completed programming the current buffer it will respond that it is ready, otherwise it will respond that it is busy. When the serial link receives a ready response it will begin transferring data to the new buffer. It can be seen that the pinging protocol is a data throttling mechanism, ensuring that the serial link transfer rate is matched to the memory device programming rate.

The robustness of the serial link may be improved by using well known communication channel error correction code (ECC) schemes. In one embodiment of an error correction scheme, parity bits are provided with the data, and thus, memory device 14 can detect transmission errors and request re-transmission. Error correction can be especially beneficial in factory environments where electro-mechanical equipment is known to generate bursts of electromagnetic interference noise causing frequent transmission errors.

Robustness may be further improved by providing a check-sum read capability. In one embodiment the host executes a check-sum command causing uC core 16 to read the entire array of memory device 14. The check-sum value calculated by memory device 14 is returned to the host to determine if programming was successful. The check-sum read capability adds robustness because it checks that the data was correctly transmitted from the host through the serial link to memory device 14 and into the memory array itself.

The easy access provided by dedicated port 104 may pose a security risk for some applications. For example, if the memory device contains instructions for automotive engine control the automobile manufacturer would want to prevent car owners from changing the instructions to alter the engine performance. In this case register 112 includes a non-volatile port lock-out bit to lock out dedicated port 104 after completion of the factory programming operation. Once locked, the port does not respond to signals on its pins, and thereby, prevents any alterations to the memory contents. The lock-out operation may be performed by transferring a lock-out bit program command from the host through the serial link to memory device 14.

A port pin 110 supplies a standardized power supply voltage directly to memory device 14 during factory programming instead of through a board power supply. By using port pin 110 to supply power for factory programming, power for the rest of the board is not needed. This simplifies supply configurations that would be necessary to accommodate the large variation in board power supply requirements. Further, the booting issues may be eliminated with the board's processor unpowered. It should be noted that the customer use of port pin 110 is optional, since memory device 14 is automatically powered for in-factory programming from whichever source is available. The preferred option is to power memory device 14 using port pin 110, and a secondary option is to use the normal supply pin for memory power. When on-chip switches select port pin 110 to supply power, an internal power node is disconnected from the normal power pin to prevent power flow from the port supply to the board. In one embodiment, the port's power and data may be supplied through a single pin.

Some memory devices may have a limited pin count that prevents adding pins such as dedicate port 104 for a factory programming port. For these memory devices, a method of programming memory device 14 may include using existing pins as a programming port. Under the low pin count requirement, these pins serve a multi purpose and provide multiple functions. A memory function is provided by multi-function pin 108 in normal operation, and a factory programming port function is provided in a factory programming operation. Thus, depending on the operating mode of memory device 14, multi-function pin 108 selects one of two desired pin functionalities. A pre-defined signaling sequence may be applied to the pins to select the operating mode. This signaling sequence does not occur during normal device operation, but is used to enter the factory programming mode.

A problem with the multi-function pin scheme is that the external host and system processor are both connected to the same pins creating a contention issue. This can be resolved by adding a resistor on the system board between the device pin and processor and connecting the host to the device pin thereby reducing the flow of contention current between the host and the processor. The resistor will increase the signal delay between the processor and the memory device so pins must be chosen which can tolerate slow switching speeds, for example, the write# pin of serial Flash products. Note that in all other respects the multi-function pin port can have the features discussed for a dedicated port. For example, it can be a single pin supplying both power and data. This would allow the write# pin to be a single pin factory port for serial Flash products.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A nonvolatile memory device, comprising:
   a dedicated serial programming port to provide a data path to memory storage dedicated to factory programming; and
   a multi-function pin to supply power and data to the nonvolatile memory device during at least non-factory programming operations.

2. The nonvolatile memory device of claim 1, further including a dedicated power pin for the programming port to receive data and provide storage in the nonvolatile memory device, the dedicated power pin further to provide power to the programming port while a power pin for normal operation of the nonvolatile memory is not powered.

3. The nonvolatile memory device of claim 2, further including on-chip circuitry to disconnect a power line in the nonvolatile memory device from a board power line when power is supplied through the dedicated power pin.

4. The nonvolatile memory device of claim 1, wherein a serial link in the nonvolatile memory device and a host supports one or more speeds.

5. The nonvolatile memory device of claim 1, wherein a device query command allows a host to determine a type of memory that is connected to the serial link.

6. The nonvolatile memory device of claim 1, wherein the nonvolatile memory device includes two buffers that can each be accessed by a serial link in the nonvolatile memory device.

7. The nonvolatile memory device of claim 1, wherein a check-sum read command is transferred on a serial link from a host to the nonvolatile memory device.

8. The nonvolatile memory device of claim 1, wherein an error correction scheme detects transmission errors on a serial link and the nonvolatile memory device is configured to responsively request re-transmission.

9. The nonvolatile memory device of claim 1, further comprising a data throttling mechanism to match a serial link data transfer rate to a programming rate of the nonvolatile memory device.

10. The nonvolatile memory device of claim 1, wherein the nonvolatile memory device includes a lock-out bit for disabling the dedicated serial programming port.

11. The nonvolatile memory device of claim 1, wherein the dedicated serial programming port is a Universal Serial Bus (USB) port.

12. The nonvolatile memory device of claim 1, wherein the dedicated serial programming port is comprised of one wire that supplies both power and data.

13. A Phase-Change Memory (PCM) device, comprising:
   a multi-function pin to perform a memory function in normal memory mode and a programming function in a factory programming mode; and
   a dedicated serial programming port to provide a data path to memory storage dedicated to factory programming.

14. The PCM device of claim 13, wherein the multi-function pin is coupled to a serial link to receive a lock-out command that locks out the multi-function pin after completion of a factory programming operation.

15. The PCM device of claim 14, wherein the multi-function pin receives programming over the serial link that is one wire.

16. The PCM device of claim 14, wherein a signaling sequence on the serial link is recognized by the PCM device as a request to activate the multi-function pin.

17. The PCM device of claim 14, further including a storage bit used to lock the multi-function pin after the PCM device has been programmed.

18. The PCM device of claim 13, wherein a dedicated power pin supplies power to the multi-function pin to receive data when the PCM device is not powered and on-chip circuitry disconnects a power line from a board power line when power is supplied through the dedicated power pin.

19. The PCM device of claim 13, further including a data-throttling protocol to control a data rate at which the PCM device processes data and indicate when data are ready to be received.

20. A Phase-Change Memory (PCM) device, comprising:
   a power pin dedicated to supply power to the PCM device when operating in a factory programming mode;
   a multi-function pin to supply power and data to the nonvolatile memory device during at least non-factory programming operations; and
   a dedicated programming port coupled to a one-wire serial link to receive factory programming data for storage in buffers, the factory programming data to be transferred from the buffers to PCM arrays in a pipeline operation.

* * * * *